United States Patent [19]
Luthi

[11] Patent Number: 5,875,199
[45] Date of Patent: Feb. 23, 1999

[54] VIDEO DEVICE WITH REED-SOLOMON ERASURE DECODER AND METHOD THEREOF

[75] Inventor: Daniel A. Luthi, San Jose, Calif.

[73] Assignee: LSI Logic Corporation, Milpitas, Calif.

[21] Appl. No.: 700,781

[22] Filed: Aug. 22, 1996

[51] Int. Cl.$^6$ .................................................. H03M 13/00
[52] U.S. Cl. .................................... 371/37.06; 371/37.4
[58] Field of Search .............................. 371/37.4, 37.06, 371/37.11

[56] References Cited

U.S. PATENT DOCUMENTS

| | | | |
|---|---|---|---|
| 4,641,324 | 2/1987 | Karsh et al. | 375/76 |
| 4,829,525 | 5/1989 | Sugiyama et al. | 371/38 |
| 4,845,713 | 7/1989 | Zook | 371/37 |
| 4,928,288 | 5/1990 | D'Aria et al. | 375/17 |
| 5,051,998 | 9/1991 | Murai et al. | 371/39.1 |
| 5,088,113 | 2/1992 | Wei | 375/53 |
| 5,181,209 | 1/1993 | Hagenauer et al. | 371/43 |
| 5,216,677 | 6/1993 | Takagi et al. | 371/40.3 |
| 5,390,195 | 2/1995 | Brush | 371/37.1 |
| 5,430,743 | 7/1995 | Marturano et al. | 371/43 |
| 5,457,704 | 10/1995 | Hoeher et al. | 371/43 |
| 5,548,684 | 8/1996 | Wang et al. | 395/21 |

OTHER PUBLICATIONS

Sklar, Bernard, *Digital Communcations: Fundamentals and Applications*, 1988 by Pretice Hall, p. 4.

Whitaker, S. et al., "Reed Solomon VLSI Codec for Advanced Television", IEEE Transactions on Circuits and Systems for Video Technology, vol. 1, No. 2, Jun. 1991, pp. 230–236.

Hagenauer, J., "Forward Error Correction Coding for Fading Compensation in Mobile Satellite Channels", IEEE Journal on Selected Areas in Communications, vol. SAC–5, No. 2, Feb. 1987, pp. 215–225.

Arazi, B., "A Commonsense Approach to the Theory of Error Correcting Codes", The MIT Press, 1988, p. 137, Dec. 1988.

Deng, R., et al., "High Rate Concatenated Coding Systems Using Bandwidth Efficient Trellis Inner Codes", IEEE Transactions on Communications, vol. 37, No. 5, May 1989.

Deng, R., et al., High Rate Concatenated Coding Systems Using Multidimensional Bandwidth–Efficient Trellis Inner Codes, IEEE Transactions on Communications, vol. 37, No. 10, Oct. 1989, pp. 1091–1095.

Hagenauer, J. et al., "A Viterbi Algorithm with Soft–Decision Outputs and its Applications", IEEE CH2682–3/89/0000–1680, pp. 1680–1686, Dec. 1989.

*Primary Examiner*—Stephen M. Baker

[57] ABSTRACT

A video device is provided having a more efficient Reed-Solomon decode methodology. The Reed-Solomon decoder advantageously receives pre-indentified error locations and, given those locations, focuses entirely upon correcting (as opposed to detecting) erroneous symbols at those locations. A noise detector is used to identify erroneous symbol intervals, and forwards information signifying erroneous symbol locations or erases symbols within those locations. The detected error locations are forwarded to the Reed-Solomon decoder which then adds (or subtracts) correction quantities to symbols within those locations. Given pre-identified error locations, the Reed-Solomon decoder can correct double the number of corrupted symbols. The decoder, herein provided, therefore proves beneficial in high speed decoding of video signals sent from a video device having forward error correction.

16 Claims, 2 Drawing Sheets

VIDEO DEVICE WITH REED-SOLOMON ERASURE DECODER AND METHOD THEREOF

RELATED APPLICATIONS

This application is related to, and filed on the same date as, U.S. Pat. No. 5,708,665 and U.S. patent application No. 08/701,632, respectively entitled "Digital Receiver Using Equalization and Block Decoding with Erasure and Error Correction" and "Digital Receiver Using a Concatenated Decoder with Error and Erasure Correction", and both having the inventorship of Daniel A. Luthi, Ravi Bhaskaran, Dojun Rhee, and Advait Mogre. These references are incorporated as though fully set forth herein.

BACKGROUND OF THE INVENTION

1. Field of the Invention

This invention relates to a video device which employs error correction on digital signals representing audio and video data. The video device includes an encoder, a decoder and a noise level detector. The noise level detector identifies noise at select data word times (i.e., locations) within the encoded signal, and thereafter forwards the identified locations to a block decoder. The identified data locations are used as a basis for increasing the performance by which correction is achieved within the block decoder.

2. Description of the Relevant Art

Error correction of digital data is well known in the field of audio and video reproduction and storage. Error correction is typically used both to restore digital information which has in some way been disrupted or lost during recordation and/or transmission. Error correction makes digital data storage and transmission much more robust than counterpart analog systems. Accordingly, error correction proves beneficial in relaxing the manufacturing tolerances of memory media as well as reducing the power and costs requirements of the transmitter and receiver.

High recording densities and unfriendly transmission environments necessitate a sophisticated error correction scheme. Errors imputed upon the digital signals generally arrive from possibly three sources: the digital recordation and reproduction system, the storage media, and/or the transmission channel interference. It is well known that recordation and reproduction errors such as aliasing and quantization affect the accuracy by which digital signals are represented. Irregularities on the storage media surface and noise (interference) placed on the transmission channel further disrupt the digital signals. Regardless of their source, errors are generally classified as random errors or burst errors. As the name implies, random errors occur in random fashion and generally have no relation to one another. Conversely, a burst error is one which occurs over a relatively long period of time and often involves the disruption of perhaps hundreds, if not thousands of bits. Burst errors may have various causes. In memory media, a burst error may be caused by a large dust particle resting on the surface of the medium. In a transmission channel, a burst error may be caused by channel fading or may be caused by periodic noise imputed on the channel. Regardless of the cause, burst errors are a commonly occurring kind of error which, due to their extended duration, pose a greater challenge to error correction than random errors.

Error correction is employed in correction of burst errors, but more importantly must do so with a minimal amount of redundant data and data processing. Reducing the probability of bit error is one of the main functions of error correction modules. A successful error correction technique can perform the aforesaid advantages not only to detect the location of errors but to correct those error locations.

Error detection and correction are brought about, in a general sense, by coding. The use of large-scale integrated (LSI) circuits has made it possible to provide substantial performance improvement through coding. Coding, and the advantages thereof, are achieved on the integrated circuit at much less cost than would be necessary if higher-power transmitters or larger antennas were used. There are a number of types of coding techniques used for error detection and correction. The two very frequently used types are block coding and convolutional coding. Block and convolutional coding serve to find errors within a sequence of structured codewords and, thereafter, to correct erroneous words within that sequence.

A sequence of structured codewords involves an information stream with additional redundant information. The codewords are composed of symbols, and the symbols can be as small as a single bit or can contain numerous bits (or a byte) of digital information. Accordingly, codewords are set forth in a code, and code can be either bit-oriented code or byte-oriented code depending upon whether the code word is represented as a plurality of single-bit symbols or a plurality of eight-bit symbols, respectively.

Error correction involves not only the detection of errors, but also correction of those errors. While block coding entails codewords formed of a block of symbols (data and check symbols) placed in a structured sequence arranged solely from the message contained in the block, convolutional coding entails a structured sequence of codewords formed from the message present in the encoder at that time, including previous messages as well. Regardless of whether block or convolutional coding is used, the resulting codeword sequence, involving data symbols and check symbols, is decoded by an error correction algorithm.

There are several types of block coding algorithms. Many of them concern the popular Reed-Solomon codes, which may be defined as block codes whose check symbols are determined by polynomial operations in a Galois field with a generator polynomial formed by multiplying monomials whose roots are consecutive elements in the field. Reed-Solomon codes are popular since the encoding can be performed by using the generator polynomial to multiply or divide a polynomial representing the message. Furthermore, low complexity methods exist for error correcting received symbol blocks. One popular decoding algorithm involves determining polynomials with roots that locate errors, and generating syndromes to correct errors. In this manner, the data symbols and check symbols within a codeword may be algebraically combined with one another to determine if a data symbol is erroneous. Determination of the erroneous data symbol location is taken from an algebraic sum of the roots. A polynomial expansion of those roots allows the Reed-Solomon algorithm to thereafter correct the data symbol location. Both detection and correction occurs within the conventional Reed-Solomon decode algorithm. The Reed-Solomon decode algorithm, and the methodology by which polynomials and roots allow detection and correction of errors, is provided and referenced in B. Sklar, *Digital Communications Fundamentals and Applications*, (Prentice Hall 1988), pp. 304–308 (herein incorporated by reference).

Unlike block coding, codeword output n-tuple of a convolutional encoding procedure is not only a function of an input k-tuple, but is also a function of the previous K–1 input k-tuples. As such, convolutional codes are often referred to as recurrent codes.

Generally speaking, a convolutional encoder may be implemented using a shift register and a plurality of encoder vectors, one for each codeword symbol. Each codeword symbol is then generated by the inner product of the corresponding encoder vector and the contents of the shift register. For example, a bit-oriented encoder might use two binary vectors to generate a two bit codeword by multiplying the contents of the shift register with each vector component-wise, and perform the sum using modulo two addition. Two code symbols are thereby generated and paired together to form a codeword. The memory of the convolutional encoder is determined by the length of the shift register, and in general, a larger memory can provide a larger coding gain. Convolutional encoding and subsequent Viterbi decoding are well documented algorithms. See, e.g., B. Sklar, *Digital Communications Fundamentals and Applications*, (Prentice Hall 1988), pp. 315–338 (herein incorporated by reference).

The performance of block encoders/decoders are especially dependent on their ability to efficiently use check symbols to reconstruct incorrect or lost data symbols. When multiple symbol errors are sustained, as in the case of a burst error, both the data symbol and the associated check symbol may be affected. To reduce the impact of this, data symbols within each codeword (or codewords amongst each other) are dispersed throughout the data stream (i.e. interleaved) before the data is recorded or transmitted. If a burst error occurs, it damages only a reproducible portion of data symbols but not all data symbols within the codeword. Upon playback the code is de-interleaved. Thus, the data symbols return to their original codeword location (i.e., to the original structured codeword) with errors properly distributed therein. Interleaving and subsequent de-interleaving greatly increases error correctability of block codes by separating each symbol from its pre-interleaved neighbors by a span of several symbols. An error occupying several data symbol intervals will affect one data symbol per codeword instead of possibly numerous pre-interleaved neighboring data symbols.

Error correction is greatly enhanced by utilizing block coding, convolutional coding and interleaving. A device which employs all three techniques in a concatenated architecture not only reduces power and bandwidth requirements, but can do so beyond that which would be required using either block or convolutional coding individually. A concatenated Reed-Solomon outer code and a convolutional inner code serves to reduce $E_b/N_0$ while achieving less than $1 \times 10_{-12}$ bit error probability. While the Viterbi decoder may output burst errors, those errors are de-interleaved before entering the Reed-Solomon decoder. The Reed-Solomon decoder depends only on the number of data word errors within a block of codewords, with minimal disturbance by burst errors. The concatenated architecture is often motivated in systems which employ high speed digital signals.

As systems evolve to higher signal processing speeds due to higher information storage densities and/or higher information transmission rates, encoders which can provide improved error correction performance will be required. For example, video data is oftentimes compressed with a high bit rate which necessitates a higher speed decoder, and a decoder which can correct more errors than conventional decoders. It is often the case that the requirement for improved performance, which typically involves substantial increases in device complexity, is accompanied by the requirement for higher throughput speeds and lower decoding delays.

SUMMARY OF THE INVENTION

The problems outlined above are in large part solved by an improved use of Reed-Solomon decoders. The improved decoder is one which is capable of handling the higher bit rate associated with video signals. The decoder is therefore advantageously used within a video device to decode a sequence of codewords encoded using a Reed-Solomon encoder.

The present decoder is specifically designed to correct up to twice the number of data symbol errors than conventional designs by taking advantage of "erasure decoding" in the Reed-Solomon decoder. As such, the improved decoder is well adapted for use as a high speed video signal decoder. The present decoder achieves higher speed decoding or more efficient decoding by employing a noise detector. The noise detector receives the digital signal at the receiver side of a transmission channel and inspects for noise on the channel during a time interval in which each data symbol is transmitted. Detected noise or, more specifically, the data symbol locations in which unacceptable noise occurs is forwarded to the Reed-Solomon decoder. The data thusly supplied is indicative of where symbol errors occur in a codeword. The noise detector thereby serves to present error locations, and the Reed-Solomon decoder serves to receive that information and correct the errors. Accordingly, the present Reed-Solomon decoder notes the position of the errors flagged (or erased) within a codeword, and thereafter can correct twice as many symbol errors than if the error locations were not pre-identified by the noise detector.

The noise detector thereby serves to generate information on the location of errors in the data stream. The Reed-Solomon algorithm is therefore used to correct errors in pre-identified locations and need not be used to calculate those locations. By reducing or eliminating the need for the Reed-Solomon algorithm to determine error locations, the Reed-Solomon algorithm can be revised to focus on correcting errors values rather than detecting error locations and then correcting error values, thereby making it possible to correct up to twice the previously correctable number of symbol errors. This version of the Reed-Solomon algorithm proves more efficient and more expeditious as a decoding algorithm for video data applications than a conventional algorithm capable of correcting the same number of errors as the revised algorithm.

Broadly speaking, the present invention contemplates a video device. The video device comprises a noise detector is configured to receive a sequence of code words. The noise detector identifies symbol error locations within the sequence of code words and sets a flag at symbol locations in which noise-determined symbol errors are detected. A Reed-Solomon decoder is coupled to receive output from the noise detector indicative of the flag status. The Reed-Solomon decoder then corrects the symbol errors at the defined locations.

The present invention further contemplates an apparatus for block decoding and error correcting erroneous code symbols within a set of data symbol locations. A noise detector serves to detect erroneous data symbol locations within the codeword, and the block decoder serves to correct errors within those locations.

The present invention yet further contemplates a method for determining erroneous symbols within a codeword that is output from a forward error correction encoder. The method further includes correcting the erroneous data symbols. A sequence of digital video data is transformed into a codeword having data symbols and check symbols. Locations within the codeword having erroneous symbols are then identified. The codeword and the identified locations of the erroneous symbols are then fed into a Reed-Solomon block decoder. The Reed-Solomon block decoder is designed to correct the erroneous symbols which have been previously identified and forwarded to the Reed-Solomon block decoder. Accordingly, the decoder serves to correct the symbols in the identified locations.

BRIEF DESCRIPTION OF THE DRAWINGS

Other objects and advantages of the invention will become apparent upon reading the following detailed description and upon reference to the accompanying drawings in which.

Figure 1:
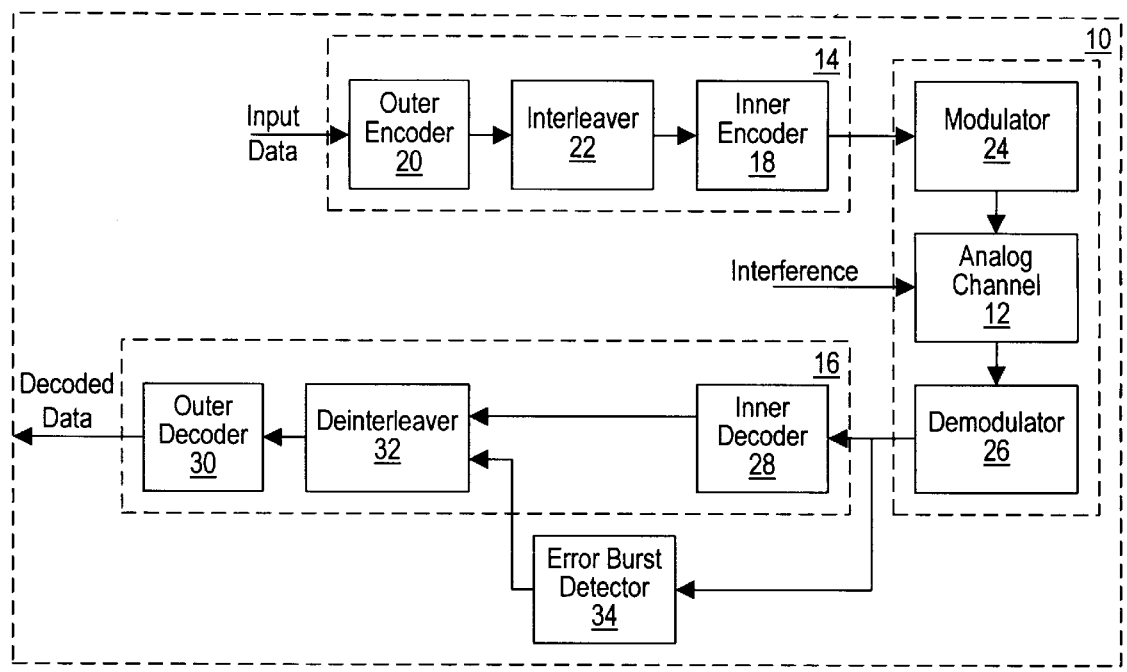
FIG. 1 is a block diagram of a video system having a concatenated encoder and decoder capable of error correcting both video data, or audio and video data.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 represents a video system 10 which employs a concatenated encoding and/or decoding scheme. Video system 10 comprises a transmission channel 12 interposed between an encoder 14 and a decoder 16. Video system 10, in conjunction with encoder 14 and decoder 16, serves to error correct digital signals sent through channel 12. Error correction, and associated coding, makes the digital signals less susceptible to noise interference upon the channel. Input data into encoder 14 represents any data derived from a video source, or a combination video and digital source. Video system 10 employs a more efficient decoder 16 which can correct data word errors at a more efficient rate than conventional decoders. More specifically, decoder 16 uses pre-identified error location information as an aid to error correction. As such, decoder 16 can accept and decode more reliably encoded digital signals sent thereto, thereby achieving a faster decoding rate than could be provided by a conventional decoder designed for the same reliability. Decoder 16 is therefore particularly suited for decoding compressed video information, or any high density bit or byte stream.

According to one embodiment, encoder 14 is a concatenated encoder which uses a convolutional inner encoder 18, a Reed-Solomon block encoder 20, with interleaving 22 between the two encoding steps. The high density input data is error correction encoded and thereafter modulated 24 by a carrier signal. Any well known modulation technique can be used, suitable modulation being frequency shift keying, phase shift keying, quaternary phase shift keying, etc. Whatever modulation scheme is used, the desired modulation output is one that is less susceptible to channel noise upon channel 12.

Retrieval of a carrier-modulated code begins with demodulation 26. Demodulation 26 serves to reproduce the digital video signal from the carrier waveform. Regardless of the form chosen, the desired outcome of demodulation 26 is to forward an encoded signal which is as free of interference noise as possible. However, noise cannot be entirely eliminated from the encoded signal—which is the main reason why encoding is used.

Output from demodulation block 26 is sent to decoder 16, which then decodes the encoded signal, according to one embodiment, using a concatenated Viterbi inner decoder 28, and a Reed-Solomon outer decoder 30. A de-interleave operation 32, which reverses the interleave operation 22, is arranged between the inner and outer decoders.

A noise detector 34 (labeled Error Burst Detector in FIG. 1) is used to detect noise upon channel 12, and thereafter discern noise locations with respect to symbols sent within the sequence of codewords. Noise detector 34 receives the encoded output from demodulate block 26 and, if the noise level for a specific symbol interval exceeds a pre-defined maximum, noise detector 34 forwards an error flag to de-interleaver 32. Alternatively, noise detector 34 erases symbols for each symbol interval during which noise exceeds a threshold value.

Noise detector 34 indicates locations of erroneous symbols within a codeword of data symbols and check symbols. Accordingly, a codeword is defined as comprising data symbols, each of which can be as small as one bit, forwarded together as a sequence of data symbols, to which one or more check symbols are appended.

Figure 2:
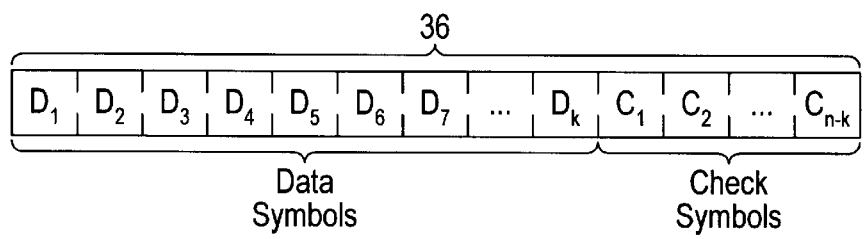
FIG. 2 is a codeword comprising a structured sequence of data symbols and check symbols encoded according to a block and/or convolutional encoder.

FIG. 2 illustrates an exemplary block codeword 36, comprising a plurality of data symbols and check symbols output from de-interleave block 32, in readiness for entry into outer block decoder 30. Codeword 36 is shown having k data symbols which are used to generate a larger number of n symbols containing both data symbols and check symbols. The number of check symbols is therefore equal to n−k. Outer decoder 30, being a block decoder, accepts block codeword 36 and corrects erroneous data symbols based upon algorithmic manipulation of both data and check symbols. A popular decode methodology, to which the present outer decoder is partially focused, involves a Reed-Solomon decode algorithm.

Figure 3:
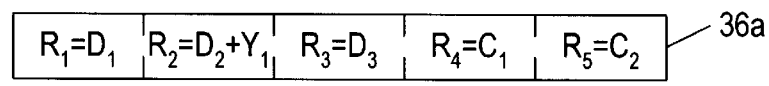
FIG. 3 is an exemplary codeword depicted as having an erroneous data symbol which can be both detected and corrected by the conventional use of a Reed-Solomon decoder.
Figure 4:
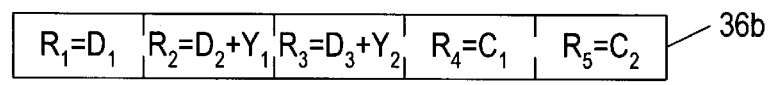
FIG. 4 is an exemplary codeword having double the number of erroneous data symbol locations detected by a noise detector and thereafter corrected by a Reed-Solomon decoder having a new use hereof.

Referring to FIGS. 3 and 4, a comparison is depicted between conventional Reed-Solomon decoding and Reed-Solomon decoding hereof. Reed-Solomon decoding produces a fixed number of partial syndromes. In the example provided, two partial syndromes can be produced by a Reed-Solomon decoder. However, it is understood that the number of partial syndromes is generally a function of the number of check symbols. If more than two check symbols are employed, then the Reed-Solomon decoder can produce more than two partial syndromes. The number of partial syndromes dictates the number of error detections and corrections. If two partial syndromes are produced, then only one detection and one correction can be performed.

The partial syndromes $S_i$, are calculated using the formula $$S_i = \sum_{j=1}^{n} R_j \beta^{(i-1)(j-1)}, \quad i = 0, 1, \ldots, 2t-1,$$

where n is the number of symbols in the codeword, $\beta$ is an element of a Galois field which is chosen during the code design process, and t is the number of errors which can be detected and corrected by the decoder. The structure of the code is chosen so that the partial syndromes are polynomials which can be expressed in terms of error values and error locations. Using the notation $Y_i$, i=1,2, ... ,v, for the error values where v is the number of symbol errors, and $e_i$, i=1,2, ... ,v, for the error symbol locations, the syndromes can be expressed as:

$$S_i = \sum_{j=1}^{v} Y_j \beta^{(i-1)(e_j-1)}, \quad i = 1, 2, \ldots, 2t,$$

yielding 2t equations and 2v unknowns, the unknowns being the error values $Y_i$ and error locations $e_i$. If the number of symbol errors is less than or equal to t, partial syndrome equations may be solved for error locations and values. It should be realized, however, that if the symbol error locations are pre-identified, the partial syndromes provide 2t equations with only v unknowns, the unknowns being the error values only. In this circumstance, if the number of symbol errors is less than 2t, the partial syndrome equations may be solved. Hence, the error correcting ability of the decoder has been doubled. Even if it is not possible to pre-identify all error locations, those that can be identified will reduce the number of unknown locations and increase the number of error values which can be solved for.

In the example of FIG. 3, and given two partial syndromes, a Reed-Solomon decoder is capable of detecting and correcting a single received symbol $R_2$ within block codeword 36a. An exemplary two partial syndromes is thereby used to first detect an erroneous data symbol and then correct that detected, erroneous data symbol. As the number of partial syndromes increase, the amount of detection and correction can increase.

In the example provided, two partial syndromes are produced and labeled $S_1$ and $S_2$. In this example, three received data symbols labeled $R_1$ through $R_3$ are provided. Accordingly, the received codeword comprises five (possibly corrupted) symbols, of which three are data symbols and two are check symbols. The following example helps illustrate Reed-Solomon decoding technique as applied to five received symbols $R_1$–$R_5$:

Syndromes $S_1$ and $S_2$ are calculated:

$$S_1 = R_1 + R_2 + R_3 + R_4 + R_5$$

$$S_2 = R_1 \beta^0 + R_2 \beta^1 + R_3 \beta^2 + R_4 \beta^3 + R_5 \beta^4$$

Assume only one received symbol is in error. Then $$S_1 = Y_1$$

$$S_2 = Y_1 \beta^{e_1}.$$

Several algorithms exist for solving to find the location and value of the symbol error. The popular algorithms begin by constructing an error locator polynomial with roots $\beta^{e_i}$, i=1,2, ... ,v. The error locator polynomial can be expressed as:

$$E(X) = \sum_{i=0}^{v} \sigma_i X^{v-i},$$

where the coefficients (other than $\sigma_0 = 1$) are found by solving the matrix equation:

$$\begin{bmatrix} S_1 & S_2 & \ldots & S_v \\ S_2 & S_3 & \ldots & S_{v+1} \\ \cdot & \cdot & & \cdot \\ \cdot & \cdot & & \cdot \\ \cdot & \cdot & & \cdot \\ S_{2t-v} & S_{2t-v+1} & \ldots & S_{2t-1} \end{bmatrix} \begin{bmatrix} \sigma_v \\ \sigma_{v-1} \\ \cdot \\ \cdot \\ \cdot \\ \sigma_1 \end{bmatrix} = \begin{bmatrix} S_{v+1} \\ S_{v+2} \\ \cdot \\ \cdot \\ \cdot \\ S_{2t} \end{bmatrix}.$$

For the current example, the matrix equation is very simple, yielding $$S_1 \sigma_1 = S_2 = Y_1 \beta^{e_1},$$

which leads to the error locator polynomial $$E(X) = X + \beta^{e_1}.$$

However, when more partial syndrome equations are involved, the effort necessary to determine the error locator polynomial coefficients increases. The direct approach is to do the matrix inversion. Other algorithms are Berlekamp's iterative method, Massey's shift register synthesis procedure, and Euclid's division algorithm.

Once the error locator polynomial has been determined, the roots can be found by a Chein search, which is an exhaustive search that consists of evaluating the error polynomial for every element of the Galois field. The other commonly used approach is to factor the polynomial using the explicit formulations available for finding the roots of polynomials of degree five or less. Finding the roots reveals $e_i$, i=1,2, ... ,v, the locations of the symbol errors.

The error values are then determined from the first v syndromes by solving the following matrix equation:

$$\begin{bmatrix} \beta^{0 \cdot e_1} & \beta^{0 \cdot e_2} & \ldots & \beta^{0 \cdot e_v} \\ \beta^{1 \cdot e_1} & \beta^{1 \cdot e_2} & \ldots & \beta^{1 \cdot e_v} \\ \cdot & \cdot & & \cdot \\ \cdot & \cdot & & \cdot \\ \cdot & \cdot & & \cdot \\ \beta^{(v-1)e_1} & \beta^{(v-1)e_2} & \ldots & \beta^{(v-1)e_v} \end{bmatrix} \begin{bmatrix} Y_1 \\ Y_2 \\ \cdot \\ \cdot \\ \cdot \\ Y_v \end{bmatrix} = \begin{bmatrix} S_1 \\ S_2 \\ \cdot \\ \cdot \\ \cdot \\ S_v \end{bmatrix}.$$

Once again, the direct approach can be used, doing the matrix inversion, or an alternate method will suffice. For the single error example, the above equation yields $$Y_1 = S_1.$$

The above algorithm can be modified to include information concerning pre-identified locations. There would be advantages in error correction if error detection is alleviated from the Reed-Solomon methodology. More particularly, if the error locations are already known, then two syndromes would yield corrections upon two code symbols instead of one. To this extent, the present invention is at least in part directed.

Noise detector 34 is advantageously used to detect a code symbol interval in which noise exists. For example, if noise detector 34 indicates two possible erroneous symbols, a block codeword 36b is presented, as illustrated in FIG. 4. Knowing the locations of erroneous symbols, a Reed-Solomon decoder can thereby be used to enhance the correction rate of symbol errors.

One algorithm for incorporating the pre-identified symbol error locations begins with the computation of the partial syndromes as described above. Separately, the coefficients $\rho_i$, i=1,2, . . . ,w, of an erasure location polynomial are determined from the following product:

$$\prod_{j=1}^{w} (X + U_j) = \sum_{k=0}^{w} \rho_k X^{w-k},$$

where w is the number of pre-identified symbol error locations. The modified syndromes are then constructed in the following manner:

$$T_j = \sum_{k=0}^{w} \rho_k S_{j-k}, j = w + 1, w + 2, \ldots, 2t.$$

The coefficients of the error locator polynomial are then calculated using the modified syndromes, and the roots found, yielding locations of symbol errors which were not pre-identified. At this point, all error locations are known. The error values are then determined in the customary way using the error locations and partial syndromes.

Returning to the example, assume that two symbol errors have occurred, but that their locations are known. Then:

$$S_1 = Y_1 + Y_2$$

$$S_2 = Y_1 \beta^{e_1} + Y_2 \beta^{e_2}$$

In this case, the number of pre-identified error locations is equal to 2t, so no modified syndromes are calculated. The algorithm proceeds immediately to the error value determination stage:

$$\begin{bmatrix} \beta^{0 \cdot e_1} & \beta^{0 \cdot e_2} \\ \beta^{1 \cdot e_1} & \beta^{1 \cdot e_2} \end{bmatrix} \begin{bmatrix} Y_1 \\ Y_2 \end{bmatrix} = \begin{bmatrix} S_1 \\ S_2 \end{bmatrix}.$$

The solution of the above equation yields:

$$Y_1 = \frac{S_1 \beta^{e_2} + S_2}{(\beta^{e_1} + \beta^{e_2})}, \text{ and}$$

$$Y_2 = \frac{S_1 \beta^{e_1} + S_2}{(\beta^{e_1} + \beta^{e_2})}.$$

The exemplary two partial syndrome equations in each case had two unknowns, which allowed for determination of those unknowns. In the first case, the two unknowns were the location and value of a single symbol error. In the second case, the two unknowns were the values of two symbol errors. Accordingly, use of a noise detector to identify erroneous locations prior to block decoding affords a more powerful decode methodology hereof. This methodology is more efficient, and faster, than a conventional decode methodology for detecting and correcting the same maximum number of symbol errors as can be corrected by the described method.

Figure 5:
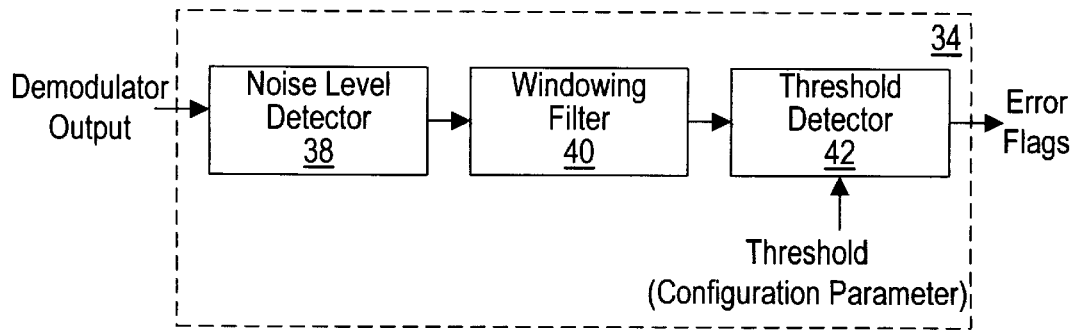
FIG. 5 is a block diagram of a noise detector of FIG. 1 which can detect errors at specific symbol intervals and thereafter identify corresponding erroneous symbol locations.

Turning now to FIG. 5, a block diagram of noise detector 34 is shown. Noise detector 34 includes a noise level detector 38, a windowing filter 40, and a threshold detector 42. Detector 38 produces a noise level signal associated with each sample provided by demodulator 26. Windowing filter 40 takes a number of past noise level signals and forms a weighted sum therefrom, and a signal representing the weighted sum is passed on to threshold detector 42. Threshold detector 42 provides a flag for each code symbol entering decoder 16 which indicates the presence or absence of a suspected symbol error in that symbol interval. The erroneous symbols are thereby identified with a flag. The flag may be set in the symbol location having erroneous information. The erased or flag-identified symbols are then forwarded to deinterleaver 32 (as shown in FIG. 1).

Figure 6:
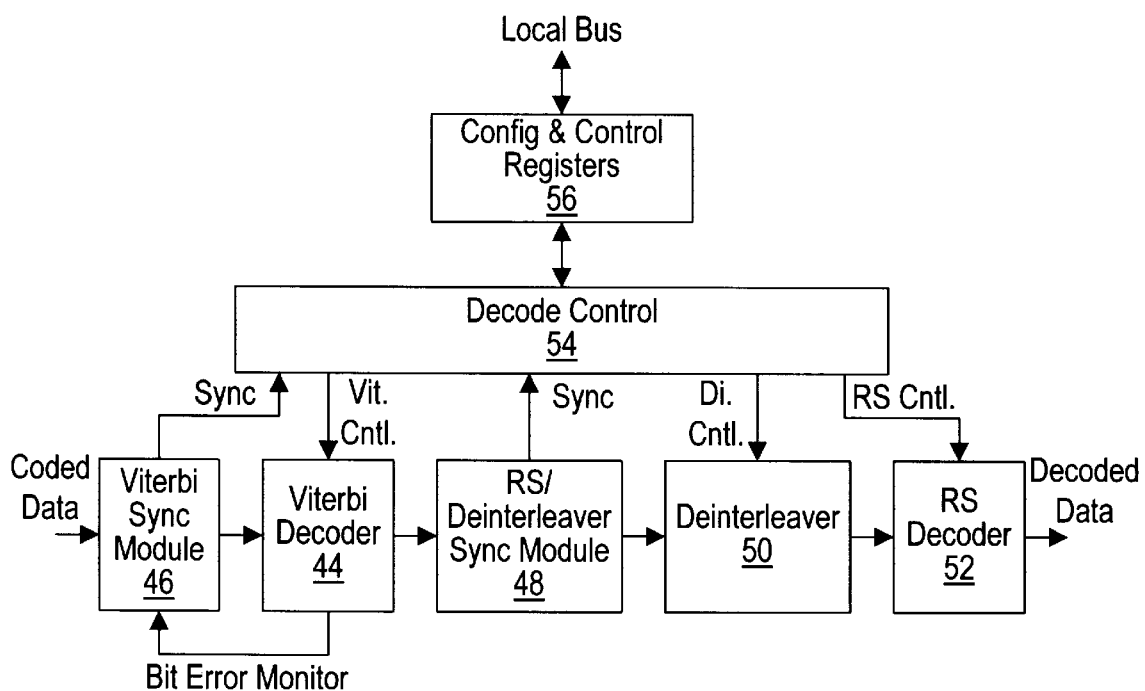
FIG. 6 is an alternate configuration of a video system with error correction capability that benefits from use of a noise detector.

FIG. 6 illustrates various control signals and accompanying synchronization of decoder 16. Synchronization is generally shown as a two stage process: synchronization using output statistics of the Viterbi decoder module for the first stage, and identification of a synchronization word for the second stage. The first stage (Viterbi decoder 44 and Viterbi sync module 46) determines the sync and out-of-sync condition by observing the valid data words and the bit errors monitored in the Viterbi decoded data stream. Once the synchronization word is identified, the Reed-Solomon/de-interleaver sync module 48 forwards a sync signal, thereby allowing assertion of a control signal and activation of de-interleaver 50. The data stream of Viterbi-decoded data is then forwarded from the output of the de-interleaver 50 to the Reed-Solomon decoder during times in which a a control is asserted.

A decode control module 54 is responsible for receiving various sync signals and thereafter forwarding appropriate Viterbi and Reed-Solomon control signals to their respective decoders. The decode control module 54 is controlled by various configuration and control registers 56 which are accessed by a microcontroller (not shown) via a local bus.

FIG. 7 illustrates an alternate configuration for a video system which does not necessarily employ a concatenated encoder and decoder. In this configuration, the decoder might be implemented using only a Reed-Solomon block decoder which would obtain a similar increased error correction ability in much the same manner as the configuration of FIG. 1.

It will be appreciated by those skilled in the art having the benefit of this disclosure that this invention is believed to be capable of applications with any Reed-Solomon decoder having a noise detector which identifies erroneous data words prior to entry into the Reed-Solomon decoder. It is also to be understood that the invention shown and described is to be taken as presently preferred embodiments. Various modifications and changes may be made to each and every block, component, feature or step, all as would be obvious to a person skilled in the art having the benefit of this disclosure. It is therefore intended that the following claims be interpreted to embrace all such modifications and changes and, accordingly, the specification and drawings are to be regarded in an illustrative rather than a restrictive sense.

What is claimed is:

1. An improved video decoder which comprises:
   a block decoder configured to receive a sequence of symbols forming codewords, wherein the block decoder is configured to convert the sequence of symbols into an error-corrected data stream while tolerating up to a predetermined number of erroneous symbols per codeword; and
   a noise detector configured to receive a sequence of demodulated signal samples having a predefined correspondence with the sequence of symbols forming codewords, wherein the noise detector is configured to form noise level estimates from the sequence of demodulated signal samples, and wherein in response to the noise level estimates, the noise detector is coupled to the block decoder to provide a signal indicative of detected error bursts and wherein the noise detector comprises a noise level detector configured to receive the sequence of demodulated signal samples and to determine an estimated noise value for each demodulated signal sample, a windowing filter coupled to the noise level detector to receive the estimated noise values and configured to produce an estimated channel noise level, and a threshold detector coupled to the windowing filter to receive the estimated channel noise level and configured to compare the channel noise level to a predetermined threshold value to produce the signal indicative of detected error bursts;

wherein the block decoder associates error burst signals with the symbols to increase the predetermined number of tolerable erroneous symbols per codeword.

2. The improved video decoder of claim 1 wherein the windowing filter produces the estimated channel noise level by forming a weighted sum from a number of past estimated noise values.

3. The improved video decoder of claim 1 wherein the noise detector sets a flag indicative of symbols corresponding to the detected error bursts.

4. The improved video decoder of claim 1 wherein the block decoder comprises a Reed-Solomon decoder.

5. The improved video decoder of claim 1, further comprising an inner decoder.

6. The improved video decoder of claim 5 wherein the inner decoder is a Viterbi decoder.

7. The improved video decoder of claim 6, further comprising a de-interleaver coupled between the Viterbi decoder and the block decoder.

8. The improved video decoder of claim 1 wherein the symbols comprise data symbols and check symbols.

9. The improved video decoder of claim 1 wherein the symbols comprise video data.

10. A method for detecting and correcting erroneous symbols within a codeword comprising:

receiving a sequence of demodulated signal samples corresponding to a sequence of symbols, the sequence of symbols forming codewords;

detecting noise corresponding to the symbols by
estimating a noise value for each demodulated signal sample;
estimating a channel noise level from the estimated noise values;
determining whether the channel noise level exceeds a threshold value;
generating an error burst signal indicative of when the channel noise level exceeds the threshold value;

receiving the sequence of symbols in a block decoder correcting the symbols corresponding to the error burst signal using the block decoder.

11. The method of claim 10 wherein correcting the symbols is performed using a Reed-Solomon decoder.

12. The method of claim 11 further comprising demodulating the symbols with a Viterbi decoder prior to correcting the symbols using the Reed-Solomon decoder.

13. The method of claim 12 further comprising de-interleaving the symbols after demodulating the symbols with the Viterbi decoder and prior to correcting the symbols using the Reed-Solomon decoder.

14. The method of claim 10 wherein estimating the channel noise level from the estimated noise values comprises forming a weighted sum of the estimated noise values for past demodulated signal samples.

15. The method of claim 10 wherein the symbols comprise video data.

16. The method of claim 15 wherein the symbols include data symbols and check symbols.

* * * * *